(12) United States Patent
Bedarida et al.

(10) Patent No.: US 7,283,396 B2
(45) Date of Patent: Oct. 16, 2007

(54) SYSTEM AND METHOD FOR MATCHING RESISTANCE IN A NON-VOLATILE MEMORY

(75) Inventors: Lorenzo Bedarida, Milan (IT); Andrea Sacco, Alessandria (IT); Giorgio Oddone, Genoa (IT); Simone Bartoli, Cambiago (IT)

(73) Assignee: Atmel Corporation, San Jose, CA (US)

( * ) Notice: Subject to any disclaimer, the term of this patent is extended or adjusted under 35 U.S.C. 154(b) by 128 days.

(21) Appl. No.: 11/193,924

(22) Filed: Jul. 28, 2005

(65) Prior Publication Data

US 2006/0279988 A1   Dec. 14, 2006

(30) Foreign Application Priority Data

Jun. 10, 2005   (IT) .......................... MI2005A1075

(51) Int. Cl.
  *G11C 16/06*   (2006.01)
(52) U.S. Cl. .............................. 365/185.2; 365/185.11; 365/210
(58) Field of Classification Search ............. 365/185.2, 365/185.11, 210, 148, 158
See application file for complete search history.

(56) References Cited

U.S. PATENT DOCUMENTS

| | | | |
|---|---|---|---|
| 5,717,632 A | 2/1998 | Richart et al. | |
| 5,748,546 A | 5/1998 | Bauer et al. | |
| 5,774,395 A | 6/1998 | Richart et al. | |
| 6,411,549 B1 | 6/2002 | Pathak et al. | |
| 6,809,976 B2 * | 10/2004 | Ooishi | 365/210 |
| 6,975,540 B2 * | 12/2005 | Kato | 365/185.2 |
| 2004/0057291 A1 | 3/2004 | Conte et al. | |

* cited by examiner

*Primary Examiner*—David Lam
(74) *Attorney, Agent, or Firm*—Sawyer Law Group LLP

(57) ABSTRACT

A method and system for approximating resistance in a non-volatile memory has a memory matrix. The memory matrix has a plurality of memory cells and a plurality of memory source lines that are coupled to the plurality of memory cells. A reference matrix is coupled to the memory matrix and has a reference cell. A logic generator is coupled to the reference matrix and is configured to generate an approximation, at the reference cell, of a resistance between a selected one of the plurality of memory cells and at least one of the plurality of memory source lines.

12 Claims, 6 Drawing Sheets

SYSTEM AND METHOD FOR MATCHING RESISTANCE IN A NON-VOLATILE MEMORY

CROSS REFERENCE TO RELATED APPLICATIONS

This application claims benefit under 35 USC 119 of Italy Application No. MI2005A 001075, filed on Jun. 10, 2005.

FIELD OF THE INVENTION

The present invention relates to non-volatile memory, and more particularly to approximating resistance in a non-volatile memory.

BACKGROUND OF THE INVENTION

Non-volatile memory is a type of memory that preserves data with or without power. Memory is an array having many individual memory cells. Most computer and electronic systems use a binary number system with bits to store data in the memory array. In a memory single bit/cell, two distinctly different current levels (corresponding to a one or a zero) that flow through the memory under the correct conditions represent each bit, while in a multilevel memory more levels are required. For example, in a two bit/cell memory, four distinctly different current levels are required.

Some memory is single-level, where one bit of information is stored in each memory cell. To each possible state (0,1) corresponds a distribution that can be described by threshold range or by current range. These ranges are usually defined by reference cells used during verify phase. In order to determine the value of the memory cell, current through the memory cell is compared to a reference cell (a read reference cell). A current through the memory cell that is lower than that through the reference cell represents one bit value, while a current through the memory cell that is higher than that through the reference cell represents the other bit value.

The currents through the memory cells fall in a range called cells distribution. The difference between matrix cell distributions themselves, and read reference cell values and the matrix cell distributions of the memory cells is one measure of the error margin. For example, in the case of a single bit/cell the distance between the one matrix cell distribution, defined during erase phase, and the zero matrix cell distribution, defined during program phase, is a measure or error margin. In this same way, the distance between each one of these two distributions and the read reference cell value, used to read if a cell of these two distributions is one or zero, is a measure of error margin. The greater the distance between these two distributions (1 and 0), the higher the current difference is between cell current and read reference current in read phase and the lower is the possibility of having a fail, along with a faster access time. Usually the matrix distribution for the value 'one' is obtained during erase using two reference cells (in verify). One reference cell is used to define the first border, called the depletion reference cell, and another reference cell is used to define the second border, called the erase reference cell. These two reference cells (depletion and erase) define in which current/threshold range matrix 'one' distribution should be. Usually one reference cell is used to define the 'zero', and it is called the program reference cell. The program reference cell is used during program (verify) to define the border closest to the 'one' distribution, so the program reference cell defines the position of the less programmed cell that is defined to be acceptable. The distance of the threshold/current of the erase reference cell and the program reference cell is a measure of the ideal distance between matrix 'one' distribution and the matrix 'zero' distribution, so it is a measure of the error margin. According to the program reference and erase reference value, the read reference value used to distinguish between 'zero' and 'one' is defined.

For multilevel memory, there are more distributions (for example in a 2 bit/cell there are 4 distributions—11, 10, 01, 00) and so there are more reference cells to define their borders and more read reference cells (three in the case of a 2 bit cell) to distinguish during read.

One problem with current comparison arises when a read operation of the memory cell occurs at a different temperature than a verify operation. The reference cell responds differently to changes in temperature compared to the memory cell because of the different resistance between memory cells in different positions along the memory array. With changing temperature, there is a change in the cells distributions of the memory and of the reference cell currents, which do not change in the same way. A change in error margin follows a change in cells distribution, with a reduction in error margin possible in particular conditions.

The problem with reduced error margins between cell distributions is compounded in multi-level memory, where the distributions tend to be closer together. Reduced error margins decrease device operating speed and accuracy, and could impact functionality.

Accordingly, what is needed is a system and method for matching resistance in a non-volatile memory in order to improve error margins. The present invention addresses such a need.

SUMMARY OF THE INVENTION

The present invention provides a system and method for approximating resistance in a non-volatile memory. A memory matrix in the non-volatile memory has a plurality of memory cells and a plurality of memory source lines that are coupled to the plurality of memory cells. A reference matrix is coupled to the memory matrix and has a reference cell. A logic generator is coupled to the reference matrix and is configured to generate an approximation, at the reference cell, of a resistance between a selected one of the plurality of memory cells and at least one of the plurality of memory source lines.

According to the method and system disclosed herein, the present invention activates a number of source lines in the reference matrix in order to better approximate the source resistance path of a memory cell in a memory matrix, with the source resistance path of the reference cell in the reference matrix. The reference cell in the reference matrix more closely tracks the behavior of the memory cells in the memory matrix, especially at different temperatures, where the conditions are more critical and the advantages are more evident. By approximating the resistance in the memory cells, the reference matrix maintains a greater error margin and therefore fewer memory fails and the memory is faster.

DETAILED DESCRIPTION OF THE INVENTION

The present invention relates to non-volatile memory, and more particularly to approximating resistance in a non-volatile memory.

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
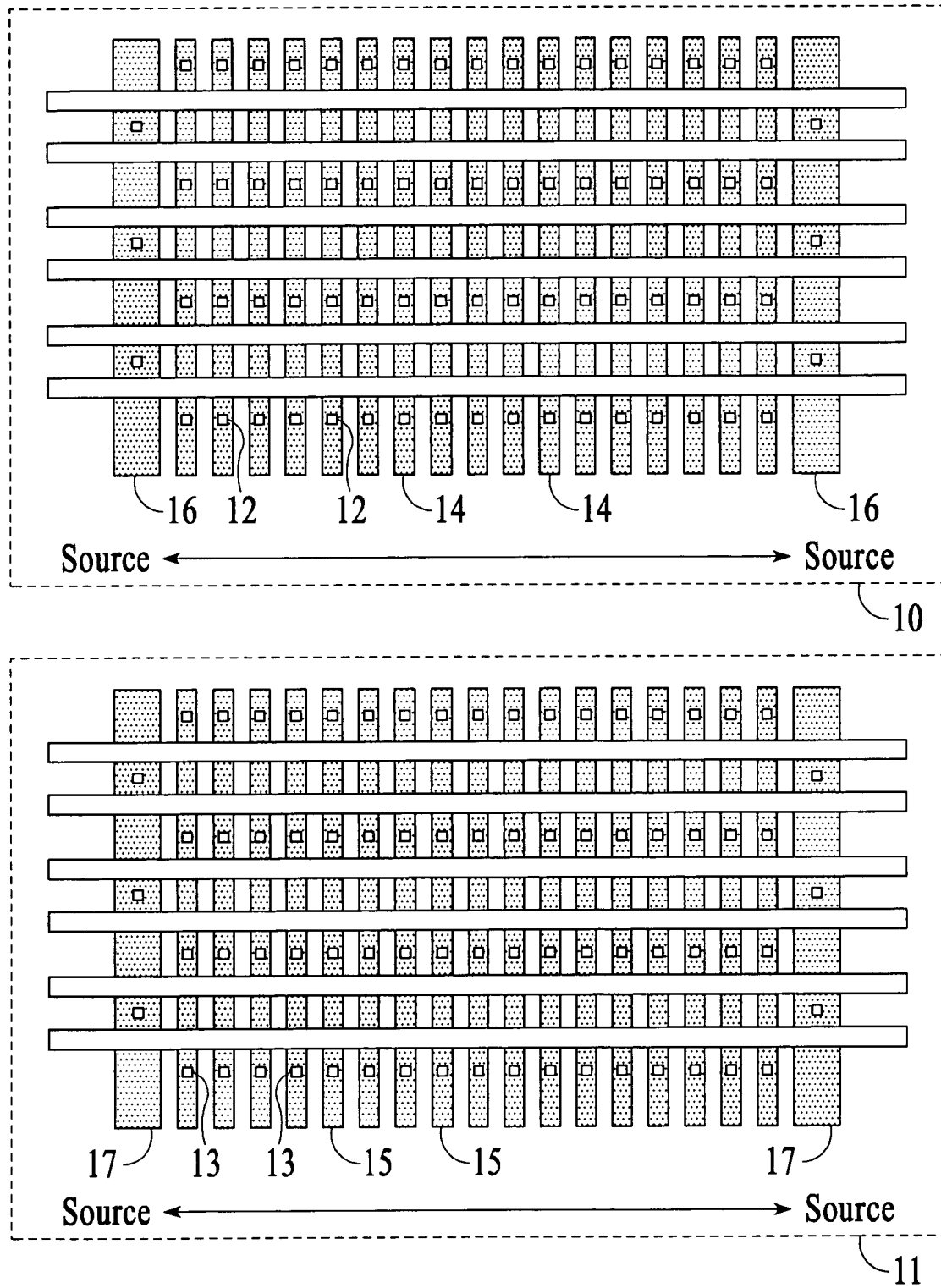
FIG. 1 is a block diagram illustrating a memory matrix architecture and a reference matrix architecture.

FIG. 1 is a block diagram illustrating a memory matrix 10 and a reference matrix 11. The memory matrix 10 includes memory cells 12 attached to bit lines 14. There are N (N being an integer greater than zero) bit lines 14 (N cells) between each two source lines 16. A memory cell 12 between two source lines 16 has a certain resistance with respect to current traveling between the two source lines and the memory cell 12 in question. The closer the memory cell 12 is to the center of the memory matrix 10, the higher the resistance is. A memory cell 12 near one of the source lines 16 has a lower resistance relative to a memory cell 12 in the center.

The reference matrix 11 includes reference cells 13 attached to bit lines 15. Only a few cells of reference matrix 11 are active, and these cells have a fixed position with respect to their source lines. There are N bit lines 15 (N cells) between each two source lines 17. A reference cell 13 between two source lines 17 has a certain and fixed total resistance with respect to current traveling between the two source lines and the reference cell 13 in question, which is different, in most cases, from the corresponding total source resistance of a cell in the memory matrix 10, which varies with addressing because of the position, between two source lines 16, of a cell of the memory matrix is a function of its address. The closer the reference cell 13 is to the center of the reference matrix 11, the higher the resistance is. A reference cell 13 near one of the source lines 17 has a lower resistance relative to a reference cell 13 in the center. All the selected memory cells 12 are typically compared during a read or verify operation with one of the reference cells 13. The position of the reference cell is fixed between two source lines 17 while the position of a cell in the memory matrix changes with its address. For example, if the used reference is fixed to be in the middle between two source lines 17, its total source resistance is significantly higher than the corresponding total source resistance of an addressed cell or memory matrix whose position is closer to one of the source lines 16.

Typically, only one reference cell 13 is used for each operation and its position is fixed inside the reference matrix, that is the distance between its source lines is fixed, do until now its resistance with respect to source lines was fixed. However, matrix selected cells position (with respect to their source lines) varies in function of the address so that often the resistance with respect to the source line (which is grounded during read) of matrix selected cells is different with respect to the read reference cell. If the read reference cell is fixed in the middle of its source line, its resistance is significantly different with addressed matrix cells when they are close to the source lines. Also, in multilevel memory and dual work devices, where there are more reference cells, the reference cells are in a fixed position inside the reference array. Multilevel memory is more critical because of the decreased distance between the distributions of the matrix cell threshold and the reference cell threshold.

Figure 2:
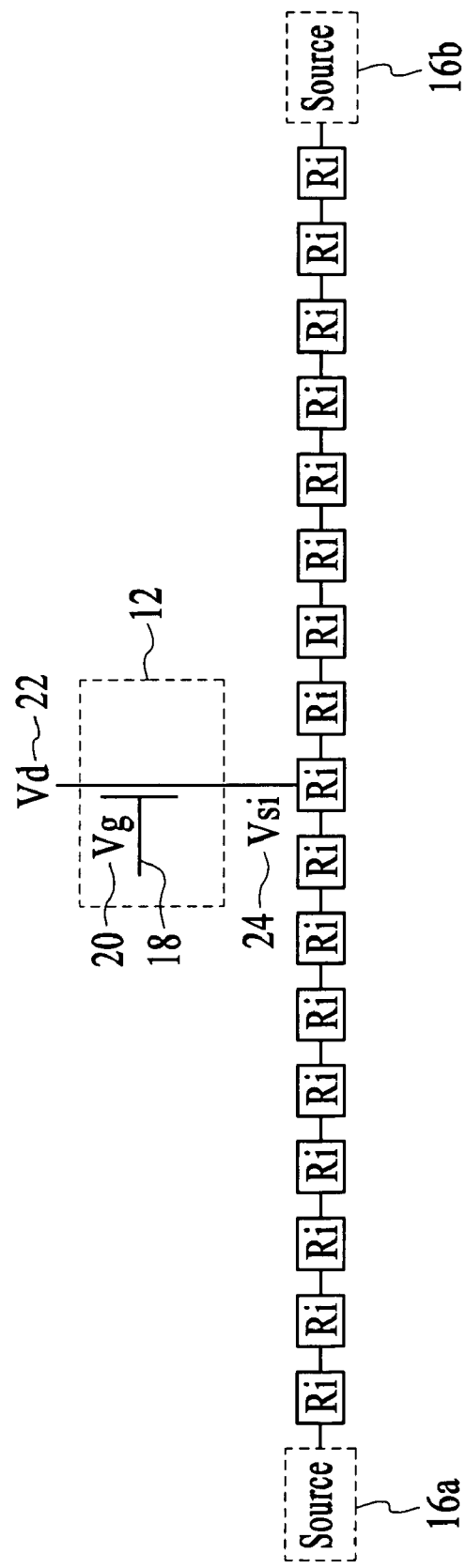
FIG. 2 is a diagram illustrating the memory cell of FIG. 1 and resistance relative to the source lines.

FIG. 2 is a diagram illustrating the memory cell 12 and resistance relative to the source lines 16. Each memory cell 12 has a gate 20, a drain 22, and a source 24, wherein the source 24 of each memory cell 12 is connected to each source line 16a and 16b (collectively referred to as 16). The gate 20 is connected to a wordline 18 and the drain 22 is connected to a bitline. The source 24 has a distance between source lines 16a and 16b, which are conducting. Each cell 12 has two resistance values, one with respect to each of the source lines 16. The resistance values are a function of how many memory cells 12 there are between the cell being evaluated and the source lines 16. If Ri is the specific source resistance for each cell 12, then a memory cell 12 in the middle of sub-memory matrix 10 (referring again to FIG. 1), with N bit lines 14 (N cells) between two source lines 16, has a cumulative/total source resistance of about Ri*N/4. The memory cell 12 immediately adjacent to one of the source lines 16 has a cumulative R resistance lower than Ri because it is the shunt between Ri and Ri*N. In other words, this cell experiences a resistance Ri with respect to the first source line and a resistance Ri*N with respect to the second source line. Due to the fact that the two source lines 16 are tied together to the same voltage then the equivalent resistance (named cumulative source resistance R) is equal to the shunt of these two resistances.

The more bit lines 14 between source lines 16, the more there is a difference in resistance between the center and edge memory cells 12 with respect to the source line 16. Logically, the resistance decreases with closer proximity to the source line 16. During a memory read, with respect to a memory cell 12, assume Vd is the voltage on the drain, Vg is the voltage on the gate, Vsi is the voltage on the source, Vt is the transistor threshold voltage, and K is a constant, then current is Idi=K(Vg−Vsi−Vt)*(Vd−Vsi). For a memory cell 12 in the middle of two source lines 16, its cumulative source resistance R is about N*Ri/4 so Vsi=Idi*R=Idi*N*Ri/4. For a memory cell 12 near a source line 16, its cumulative source resistance R is about Ri so the voltage on the source Vsi is approximately Vsi=Id*R=Id*Ri. Ideally, memory cells 12 having the same voltage threshold Vt should be able to pass the same current, but if they are in different positions between two source lines 16, due to the different cumulative source resistances R, this does not happen. In an ideal case, each memory cell 12 with the same Vt would have a current of 10 uA (micro Amps). In practice however, a memory cell 12 near a source line 16 passes a current of 9.75 uA while a memory cell in the middle of two source lines 16 passes a current of 7 uA. The memory cells 12 near the center pass a lower current because of the effect of its greater cumulative source resistance R.

During a read or verify operation of a memory matrix 10, the current difference between memory cells 12 in the center and those near the edge may pose a problem. Because cells of memory matrix 10 are being compared to reference cells (usually one for each operation) in a reference matrix 11, and the results of a comparison between the current in the memory matrix 10 and the current of the reference cells in the reference matrix 11 determine the value of the cell in the memory matrix 10, there must be a careful match in the behavior of the cell of the memory matrix 10 with the behavior of the reference cell in the reference matrix 11. However, the flash cell in the memory matrix 10 usually responds to changes in temperature in a manner that is different, due to the cumulative source resistance R of each memory cell 12, than the reference cell in the reference matrix 11 because reference cells in the reference matrix 11 have a fixed position and therefore a fixed cumulative source resistance while position (and cumulative source resistance) of a flash cell in the memory matrix 10 varies as a function of its address.

Figure 3:
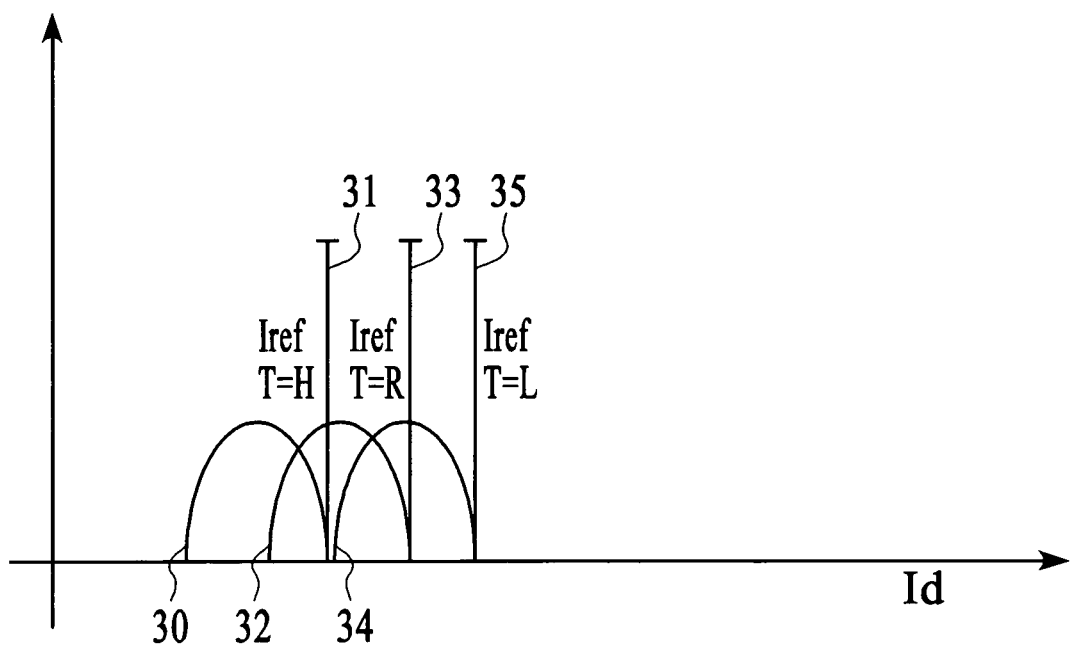
FIG. 3 is a diagram illustrating ideal temperature shift of a reference cell current and of matrix cells current distribution in a memory matrix architecture.
Figure 4:
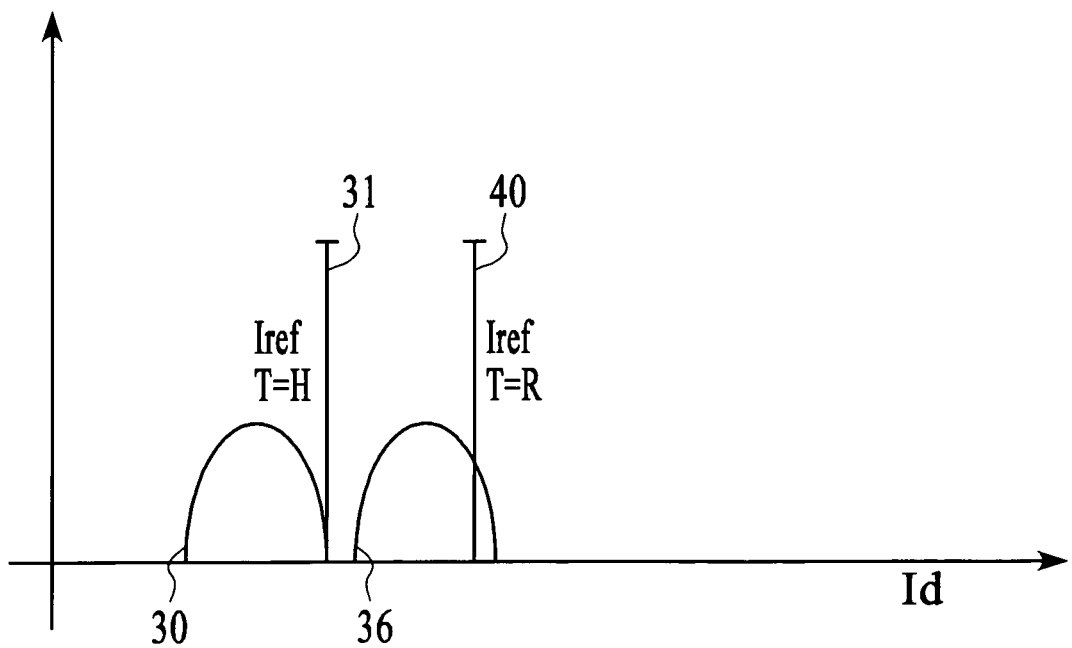
FIG. 4 is a diagram illustrating a real temperature shift of reference current and matrix cells current distribution from high to normal temperature in a memory matrix architecture.
Figure 5:
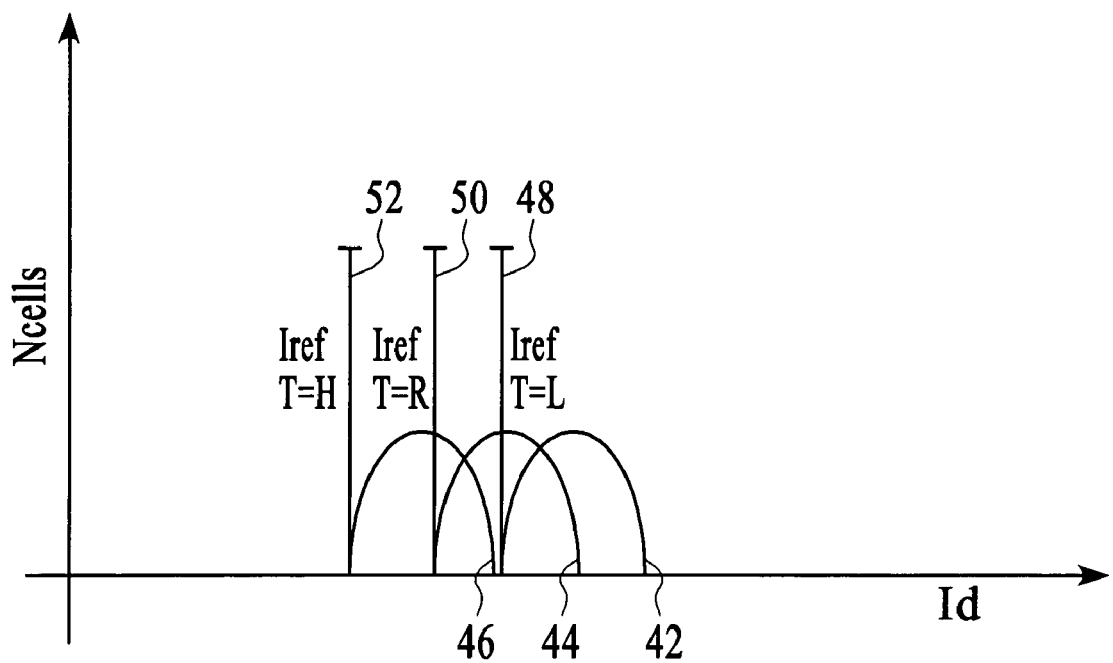
FIG. 5 is a diagram illustrating ideal temperature shift of reference cell current and matrix cells current distribution in a memory matrix architecture.
Figure 6:
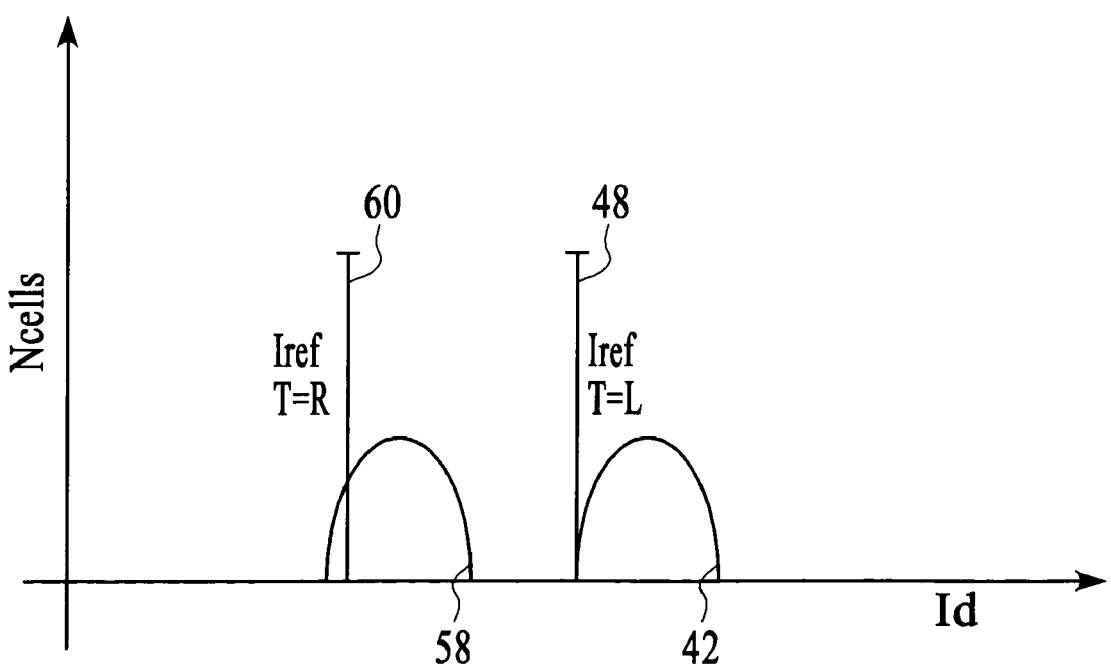
FIG. 6 illustrates a real temperature shift of reference current and matrix cells current distribution from low to normal temperature in a memory matrix architecture.

Having discussed the existence of a cumulative source resistance R that varies as a function of address for the flash cells in the memory matrix 10 while it is fixed for reference cells in the reference matrix and so the fact that for this reason the major part of cells of memory matrix 10 and reference cells of reference matrix 11 respond differently to changes in temperature having different cumulative source resistances, FIGS. 3-7 illustrate the effect of changing temperature on the error margin. FIGS. 3 and 5 illustrate ideal cell distribution behavior, while FIGS. 4 and 6 illustrate one example of real cell distribution behavior. Finally, in FIG. 7 the effect of real cell distribution behavior is illustrated with respect to reduced error margin in memory matrix 10. Reference numerals found in FIG. 1 are referred to in the description for FIGS. 3-7.

FIG. 3 is a diagram illustrating the ideal temperature current shift of one matrix cell distribution in memory matrix 10. Temperature current shift, referred to by reference numerals 31, 33, 35, is the temperature current shift of the reference cell used (during verify phase) to define the right border of the distribution. In order to determine the value stored in the memory cell 12, the distribution must be above or below current threshold discussed earlier. The horizontal axis represents current Id while the vertical axis represents cell numbers. Distribution 30 illustrates the matrix cells distribution obtained after a verify operation (done with reference cell current 31) at a high temperature, for example 90 degrees Celsius. In contrast, distributions 32 and 34 represent ideal normal (room) and low temperature situations, respectively, for example negative 40 degrees Celsius. In FIG. 3 there are three distributions of matrix cell thresholds at three temperatures, defined for the right corner using one reference cell that has different values according to the temperature (31, 33, 35). In the ideal case the right distribution border matches for all temperatures with the corresponding reference current (of reference cells) used during verify phase to define the border. In order to define the right border, the current of a reference cell is given at three different temperatures. The ideal case always matches with the right border of the matrix cells distribution varying temperature. Current 31 is the current of the reference cell at high temperature. Current 33 is the current of the same reference cell at room temperature. Current 35 is the current of the same reference cell at low temperature.

In contrast to FIG. 3, FIG. 4 illustrates a real reference and matrix cells distribution shift from high to normal temperature. The horizontal axis represents current Id while the vertical axis represents cell numbers. Assume that a current distribution for a non-volatile memory has been obtained with a correspondent verify phase at high temperature. Distribution 30 results, which is the same in FIG. 3, as illustrated by the current 31. However, further assume that the device cools to normal (room) temperature, at which time distribution 36 results, where the distribution of cells is further to the right than in the ideal case, as illustrated by current 40. The rightward shift in distribution 36 (relative to the ideal position, indicated by current 40) was caused by the temperature difference between the times at which the distributions were taken. The effect of the shift, for the normal temperature reading, is to narrow the margin of error on the right side of the distribution 36, where a comparison could be made.

FIG. 5 is a diagram illustrating ideal temperature current shift of one matrix cell distribution in memory matrix 10. Temperature current shift, referred to by reference numerals 52, 50 and 48, is the temperature current shift of the reference cell used (during verify phase) to define the left border of the distribution. The horizontal axis represents current Id while the vertical axis represents cell numbers. Distribution 42 illustrates the matrix cells distribution obtained after a verify operation (done with reference cell current 48) at low temperature. In contrast, distributions 44 and 46 represent ideal normal and high temperature situations, respectively. Current 52 is the current of the reference cell at high temperature. Current 50 is the current of the same reference cell at room temperature. Current 48 is the current of the same reference cell at low temperature.

In contrast to FIG. 5, FIG. 6 illustrates a real reference and matrix cells distribution shift from low to normal temperature in memory matrix 10. The horizontal axis represents current Id while the vertical axis represents cell numbers. Assume that a current distribution for a non-volatile memory has been obtained with a correspondent verify phase at low temperature. Distribution 42 results, which is the same in FIG. 5, as illustrated by reference current at low temperature 48. However, further assume that the device warms to room temperature, at which time distribution 58 results, where the distribution of cells is further to the left than in the ideal case, as illustrated by reference current at room temperature 60. The leftward shift in distribution 58 (relative to the ideal position, indicated by current 60) was caused by the temperature difference between the times at which the distributions were taken. The effect of the shift, for the room temperature reading, is to narrow the margin of error on the left side of the distribution 58.

Figure 7:
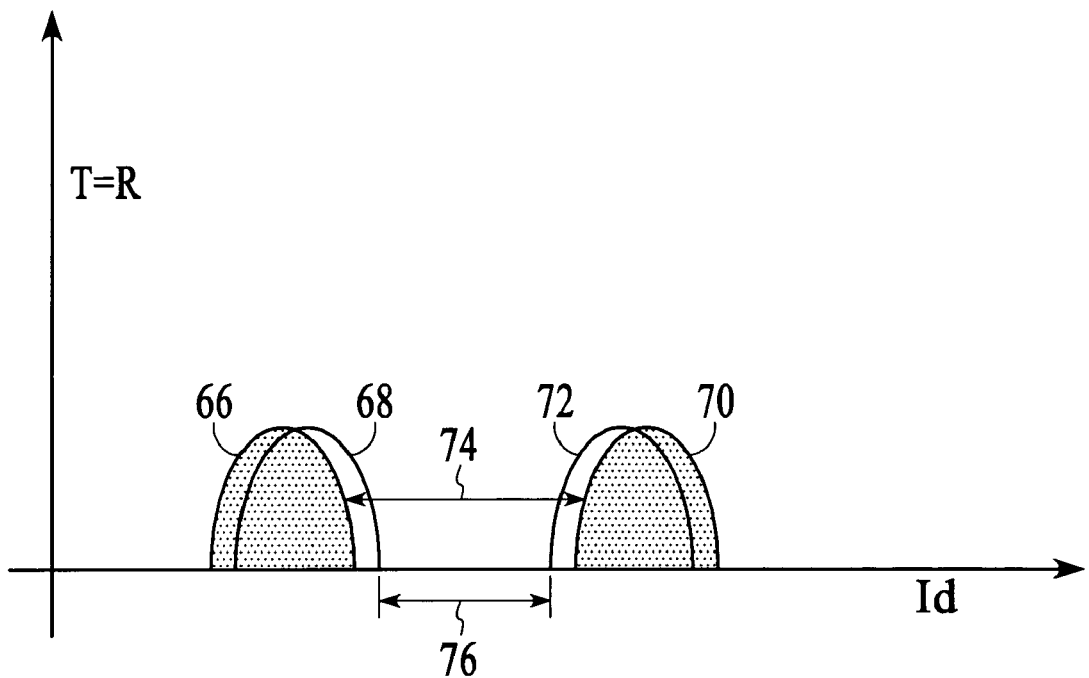
FIG. 7 illustrates an ideal current margin between distributions of matrix cells current distribution from low to normal temperature in a memory matrix architecture.

The effect of the distribution shifts is illustrated in FIG. 7. FIG. 7 illustrates an ideal reference cell distribution current margin contrasted with a real reference cell distribution current margin. The horizontal axis represents current Id while the vertical axis represents cell numbers. Ideal distribution 66 is left of real distribution 68, which may be arrived at through the situation described in FIG. 4 where the current distribution is obtained at high temperature (with verify) and then the device cools to normal temperature. Ideal distribution 70 is right of real distribution 72, which may be arrived at through the situation described in FIG. 6 where the current distribution is obtained at low temperature (with verify) and then the device warms to normal temperature. The space between ideal distributions 66 and 70 is the ideal error margin 74 for a device. The further apart the margin is, the more the tolerance for error is in the memory cells without compromising performance or data. Conversely, the narrower the error margin, the less the tolerance for error is and the slower the device operates. The real error margin 76 is narrower than the ideal error margin, hence providing less tolerance for error in the memory cell as compared to the ideal case. Current between distributions 68 and 72 is used to establish the value stored in a memory cell. The narrower the margin, the more likely that the current will overlap one of the distributions 68 and 72 and therefore result in a fail.

The distribution of matrix cells (generally) are defined during verify phase, where there are typically two reference cells that define the left and right border, respectively, for each distribution. The current distance between two different distributions, for example 01 and 10 in a multilevel memory, should be equal (in the ideal case) to the current distance between the current of the reference cell used to define the right border of the first distribution and the current of the other reference cell used to define the left border of the second distribution. Because of temperature shift, read operations may slow down and failure rates increase, partly due to reduction in distance between the distributions.

Figure 8:
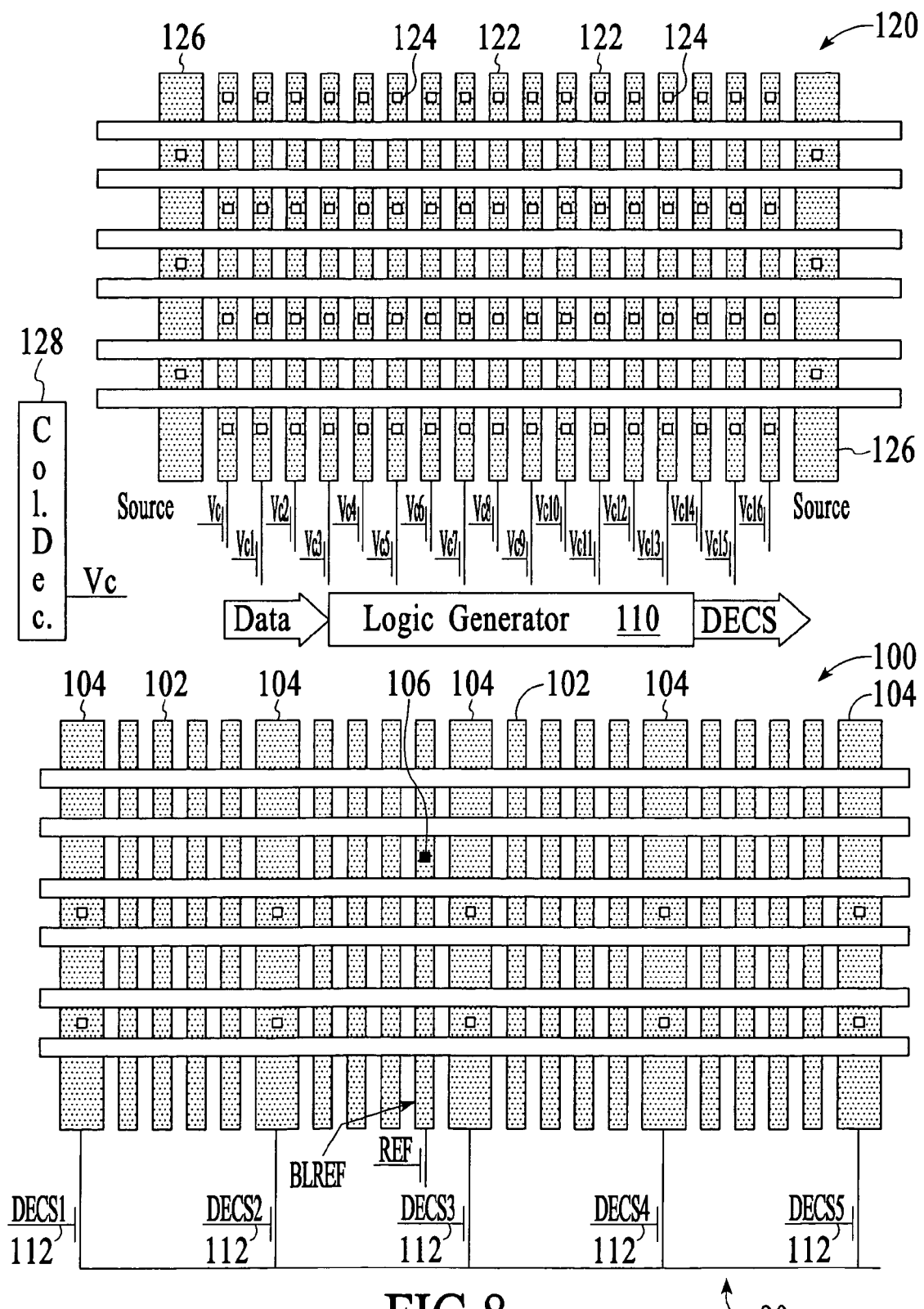
FIG. 8 is a block diagram illustrating one embodiment of a reference array in accordance with the invention.

FIG. 8 is a block diagram illustrating one embodiment of a memory device 90 in accordance with the invention. A reference matrix 100 includes bit lines 102, reference source lines 104, and reference cells 106. A memory matrix 120 includes N bit lines 122 between every two source lines 126. Each of the bit lines 122 may have several memory cells 124. A column decoder 128 activates one of bit lines 122 during a memory operation. Conventional reference arrays have N columns of cells between every two source lines, as the memory matrix has. In contrast, reference matrix 100 includes multiple reference source lines 104 interspersed among N bit lines, with reference cell 106.

Figure 9:
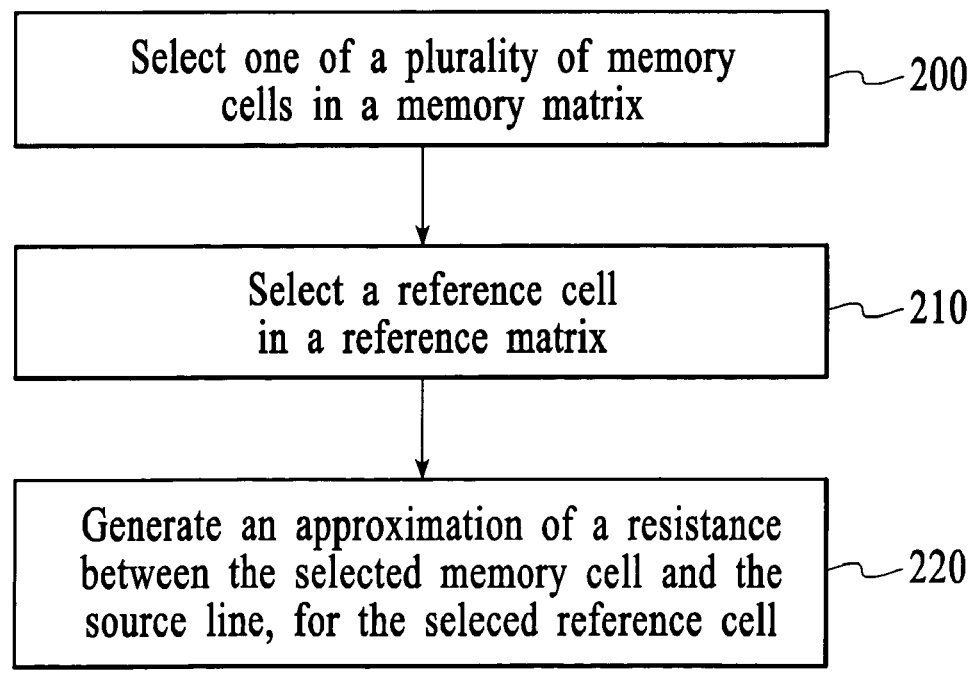
FIG. 9 is a flow diagram of one method of approximating resistance in the reference matrix of FIG. 8.

A logic generator 110 is connected to transistors 112 and activates one or more of transistors 112 based on the resistance of a selected memory cell in a memory matrix to the source line. FIG. 9 illustrates one method of implementing the invention.

FIG. 9 is a flow diagram of one method of approximating resistance in the reference matrix 100 of FIG. 8. FIG. 8 and FIG. 9 will be discussed concurrently. Assume that the memory device 90 encompassing both memory matrix 120 and reference matrix 100 has a need to perform an operation with one of memory cells 124. In block 200, the memory device selects one of memory cells 124 in the memory matrix 120. Any one of memory cells 124 may be selected.

In order to perform the memory operation, for example a memory read or verify, in block 210 the memory device selects reference cell 106. While the memory matrix 120 selects a different memory cell 124 in each operation, where the position of the memory cell 124 changes based on the selected row and column, reference matrix 100 selects the same reference cell 106 for each operation.

In block 220, the memory device generates an approximation, at the reference cell 106 selected in block 210, of the resistance between the selected memory cell and the source line, by activating the appropriate reference source lines 104.

The resistance may be determined in several ways. For example, the resistance may be measured and the measured resistance value may be transmitted to the logic generator 110, which determines how many reference source lines 104 to activate in order to best approximate the resistance value.

In another example, the resistance may be known or generalized, based on circuit behavior and the position of each memory cell 124, such that column decoding information from column decoder 128 is transmitted to logic generator 110, which then determines which and how many source lines 104 to activate based on the position of a selected memory cell 124.

The approximation of the resistance is created by the number of reference source lines 104 activated. Fewer reference source lines 104 degrades the precision at which the resistance can be approximated using the invention, while more reference source lines 104 improves the precision. In another embodiment, the resistance may be approximated by some other variable resistance device interposed between a reference cell 106 and a reference source line 104, for example a variable number of transistors, or transistors with a variable and controlled gate, whose value depends on position.

In another embodiment, a different reference cell 106 may be selected than would have been selected in a conventional system, in order to better position the reference cell 106 with respect to resistance values between reference source lines 104. In this case a higher number of reference cells may be needed, with the drawbacks of increased testing time and control circuits. A good compromise may be reached by slightly increasing the number of reference cells and using more source lines as indicated.

One skilled in the art will recognize that there are numerous methods to approximate the resistance between the memory cell and source line, and pick a suitable number and position of source lines to activate in the reference array. Also, more or less source lines per N bit lines may be included in the reference matrix than illustrated in FIG. 8.

Advantages of the invention include reducing memory failure, increasing device performance by decreasing access time, improving control of distribution, and increasing the number of bit lines between two source lines with a significant advantage of area, therefore resulting in a small device. A memory implementing the invention may have higher performance and be smaller.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A non-volatile memory comprising:
    a memory matrix including,
        two voltage source lines;
        N bitlines, each of the N bitlines of the memory matrix being located between the two voltage source lines, where N is an integer greater than zero;
        N memory cells respectively attached to the N bitlines of the memory matrix;
    a reference matrix including,
        M voltage source lines, where M is an integer greater than two;
        N bitlines; and
        N reference cells respectively attached to the N bitlines of the reference matrix, wherein the M voltage source lines are interspersed among the N bitlines of the reference matrix such that there are less than N bitlines of the reference matrix located between corresponding pairs of the M voltage source lines;

a decoder to select a first memory cell of the N memory cells in the memory matrix; and a logic generator to activate pre-determined ones of the M voltage source lines so that a reference cell in the reference matrix that corresponds to the first memory cell has a resistance that approximates a resistance associated with the first memory cell.

2. The non-volatile memory of claim 1, wherein the resistance of the first memory cell being approximated is a source resistance of the first memory cell relative to the two voltage source lines of the memory matrix.

3. The non-volatile memory of claim 2, wherein the logic generator activates the pre-determined ones of the M voltage source lines based on a position of the first memory cell in the memory matrix.

4. The non-volatile memory of claim 3, wherein each memory cell comprises a transistor having a gate, a drain, and a source, wherein the gate is connected to a corresponding wordline, the drain is connected to a corresponding one of the N bitlines, and the source is connected to each of the two voltage source lines.

5. The non-volatile memory of claim 3, wherein the non-volatile memory is a single-level memory.

6. The non-volatile memory of claim 3, wherein the non-volatile memory is a multilevel memory.

7. The non-volatile memory of claim 3, wherein the non-volatile memory is a flash memory.

8. A method for approximating a resistance associated with a memory cell in a non-volatile memory, the non-volatile memory comprising a memory matrix and a reference matrix, the memory matrix including a plurality of memory cells and a plurality of voltage source lines, the reference matrix including a plurality of reference cells and a greater number of voltage source lines than the memory matrix, the method comprising:

selecting a first memory cell of the plurality of memory cells in the memory matrix, the first memory cell having a first resistance relative to the plurality of voltage source lines of the memory matrix;

selecting a first reference cell of the plurality of reference cells that corresponds with the first memory cell; and activating pre-determined ones of the plurality of voltage source lines of the reference matrix so that the first reference cell has a resistance that approximates the first resistance associated with the first memory cell.

9. The method of claim 8, wherein activating the pre-determined ones of the plurality of voltage source lines of the reference matrix includes activating the pre-determined ones of the plurality of voltage source lines of the reference matrix based on a position of the first memory cell in the memory matrix.

10. The method of claim 9, wherein the non-volatile memory is a single-level memory.

11. The method of claim 9, wherein the non-volatile memory is a multilevel memory.

12. The method of claim 9, wherein the non-volatile memory is a flash memory.

* * * * *